United States Patent [19]

Goto et al.

[11] Patent Number: 4,760,287
[45] Date of Patent: Jul. 26, 1988

[54] VOLTAGE COMPARATOR CIRCUIT

[75] Inventors: Junkei Goto, Kawasaki; Masayuki Sahoda; Tetsuya Iida, both of Yokohama, all of Japan

[73] Assignee: Kabushiki Kaisha Toshiba, Kawasaki, Japan

[21] Appl. No.: 27,404

[22] Filed: Mar. 18, 1987

[30] Foreign Application Priority Data

Mar. 29, 1986 [JP] Japan .................................. 61-72119

[51] Int. Cl.[4] ............................................. H03K 5/24
[52] U.S. Cl. .................................... 307/355; 307/356; 307/362
[58] Field of Search ........................ 307/355, 356, 362

[56] References Cited

U.S. PATENT DOCUMENTS 4,547,683  10/1985  Bingham ............................. 307/356
4,695,748  9/1987  Kumamoto .......................... 307/355

FOREIGN PATENT DOCUMENTS 0135418  10/1980  Japan ................................... 307/355

OTHER PUBLICATIONS

Dingwall, "Monolithic Expandable 6 Bit 20 MHz CMOS/SOS A/D Converter," IEEE Journal of Solid–State Circuits, vol. SC-14, No. 6, pp. 926–932, Dec. 1979.

Primary Examiner—John Zazworsky
Attorney, Agent, or Firm—Finnegan, Henderson, Farabow, Garrett & Dunner

[57] ABSTRACT

In the comparator circuit, the amplifier circuit is comprised of an inverting amplifier section having a high gain and a noninverting amplifier section having a low output impedance. Therefore, the comparator circuit has a high input sensitivity. The comparator circuit can also operate at a high speed.

4 Claims, 8 Drawing Sheets

PRIOR ART

F I G. 6
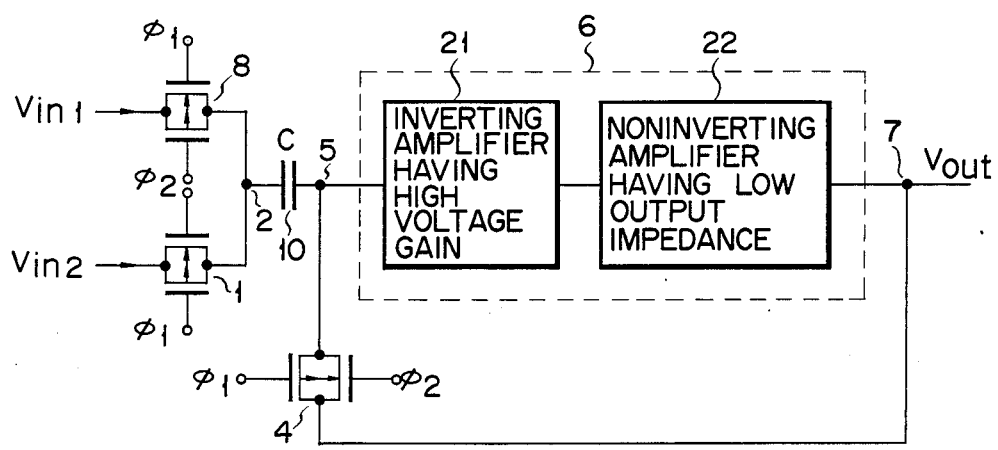

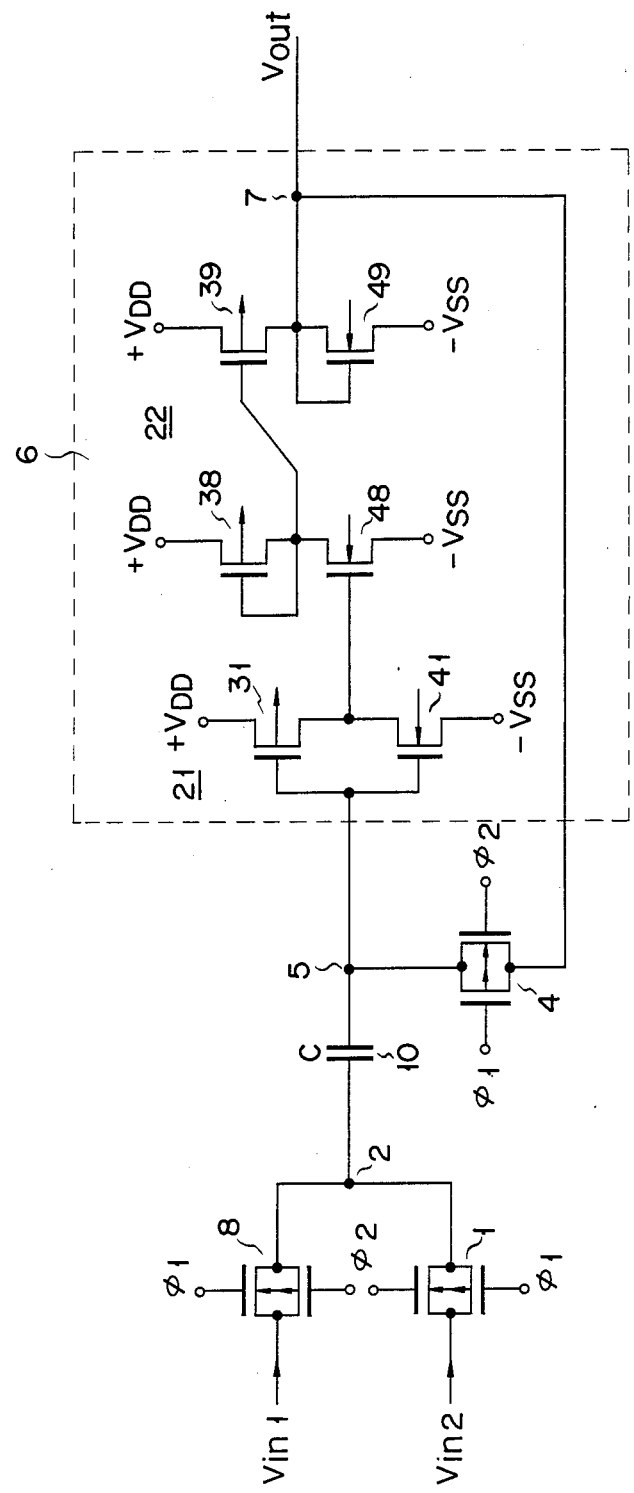
F I G. 21

VOLTAGE COMPARATOR CIRCUIT

BACKGROUND OF THE INVENTION

The present invention relates to a voltage comparator circuit and, more particularly, to a voltage comparator circuit which is suitable for use in an A/D (analog/digital) converter.

Prior voltage comparator circuits have been disclosed in such literature as, "Monolithic Expandable 6 bit 20 MHz CMOS/SOS A/D Converter", 1979, IEEE Journal of Solid-State Circuits, Vol. SC-14, U.S. Pat. No. 3,676,702, and the like.

A conventional voltage comparator circuit will now be described, with reference to FIGS. 1 to 5. FIG. 1 is a circuit diagram showing a conventional voltage comparator circuit. FIG. 2 shows waveforms of clocks $\phi_1$ and $\phi_2$ for controlling the operation of the voltage comparator circuit of FIG. 1.

In FIG. 1, when $\phi_1 = V_{SS}$ ("logic 0") and $\phi_2 = V_{DD}$ ("logic 1"), a transfer gate 1 is opened by clocks $\phi_1$ and $\phi_2$, and a voltage $V_c$ of an output node 2 thereof an input signal $V_{in2}$. In other words, $V_c = V_{in2}$. A transfer gate is constituted by an N-channel MOS transistor connected in parallel with a Pchannel MOS connector transistor. A transistor gate 4 composed of a P-channel MOS transistor and an N-channel MOS transistor is also similarly opened by clocks $\phi_1$ and $\phi_2$, and an output voltage $V_{out}$ on output terminal 7 of an amplifier 6 is fed back to a node 5 of transfer gate 4. Amplifier 6 is composed of a P-channel MOS transistor and an N-channel MOS transistor which are serially connected between $V_{DD}$ and $V_{SS}$.

FIG. 3 is a characteristic diagram of input and output voltages of amplifier 6. In FIG. 3, the abscissa indicates an input voltage $V_{in}$ of the amplifier, and the ordinate represents an output voltage $V_{out}$ thereof. The input/output characteristics of the amplifier are as shown by a curve A. The DC feedback characteristic, which is derived when the input and output are short-circuited, is as shown by a curve B. Therefore, a voltage $V_{in}$ at node 5 becomes the voltage at the point where curves A and B cross, in FIG. 3. The voltage at the intersect point of curves A and B is defined as the operating point voltage $V_{op}$ of amplifier 6; i.e., $V_{in} = V_{out} = V_{op}$.

Next, when clock $\phi_1 = V_{DD}$ ("logic 1") and $\phi_2 = V_{SS}$ ("logic 0"), transfer gates 1 and 4 are closed, and a transfer gate 8 is opened, so that an input voltage $V_{in1}$ is input and voltage $V_c$ at node 2 becomes $V_c = V_{in1}$. In this case, since the potential difference across a capacitor 10 does not change potential $V_{in}$ at node 5 is changed only by the amount of potential change at node 2, i.e., only by the amount of ($V_{in1} - V_{in2}$). Therefore, potential $V_{in}$ at node 5 becomes $$V_{in} = (V_{in1} - V_{in2}) + V_{op}$$

Assuming that gain K of amplifier 6 is less than "zero", output voltage $V_{out}$ becomes $$V_{out} = K \cdot (V_{in1} - V_{in2}) + V_{op}$$

In order to increase the operation speed and the input sensitivity of the voltage comparator circuit, it is required that the amplifier has a high voltage gain K and a low output impedance Zout. Voltage gain K and output impedance Zout of a conventional amplifier will now be considered.

FIG. 4 is a circuit equivalent to amplifier circuit 6 of the comparator of FIG. 1. FIG. 5 shows $V_{DS}$-$I_{DS}$ characteristics ($V_{DS}$: drain-source voltage, $I_{DS}$: drain-source current) of the P-channel type MOS transistor and N-channel type MOS transistor which constitute amplifier 6.

From the equivalent circuit shown in FIG. 4, voltage gain K is expressed as follows:

$$K = gm \cdot r_{dst}$$

where, $gm = gmN + gmP$ and $$r_{dst} = \frac{r_{dsN} \cdot r_{dsP}}{r_{dsN} + r_{dsP}}$$

Output impedance $Z_{out}$ becomes $$Z_{out} = r_{dst}$$

where, gm is a mutual conductance, gmN is a natural conductance of the N-channel MOS transistor, gmP is a mutual conductance of the P-channel MOS transistor, $r_{dst}$ is a saturation drain resistance, $r_{dsN}$ is a saturation drain resistance of the N-channel MOS transistor, and $r_{dsP}$ is a saturation drain resistance of the P-channel MOS transistor.

From FIG. 5, it will be understood that $r_{dsN}$ and $r_{dsP}$ are expressed as follows:

$$r_{dsN} = \Delta V_N / \Delta I_N$$

$$r_{dsP} = \Delta V_P / \Delta I_P$$

$\Delta V_N$ and $\Delta V_P$ denote microchanges in the amount of the voltages which are applied between the source and drain of each of the N-channel and P-channel MOS transistors, respectively. $\Delta I_N$ and $\Delta I_P$ denote microchanges in the amount of the currents which flow through the N-channel and P-channel MOS transistors corresponding to $\Delta V_N$ and $\Delta V_P$, respectively. When the channel lengths of the P-channel and N-channel MOS transistors are reduced, $\Delta V_P / \Delta I_P$ and $\Delta V_N / \Delta I_N$ decrease, as does output impedance $Z_{out}$. However, voltage gain K is also reduced. On the other hand, when the gate lengths are increased, voltage gain K increases, and so does output impedance $Z_{out}$.

As is mentioned above, in the amplifier used in the conventional example of FIG. 1, when the gain of the amplifier is increased, the output impedance is also increased. On the other hand, when the output impedance of the amplifier is decreased, the gain is also decreased. Consequently, a voltage comparator circuit having high speed and high input sensitivity cannot easily be realized.

SUMMARY OF THE INVENTION

It is therefore an object of the present invention to provide an amplifier having a high voltage gain and a low output impedance, and thereby to provide a voltage comparator circuit having a high speed and a high input sensitivity.

In the present invention, the amplifier is constituted by a cascade circuit of an inverting amplifier section having a high voltage gain, and a noninverting amplifier section having a low output impedance. The voltage gain of the inverting amplifier section having a high voltage gain becomes that of the amplifier. The output impedance of the noninverting amplifier section having a low output impedance becomes that of the amplifier.

According to the present invention, there is provided a voltage comparator circuit comprising:

first and second switching means to whose input terminals first and second input signals are respectively input, output terminals of said first and second switching means being commonly connected;

a capacitive element;

an amplifier circuit comprising a cascade circuit of an inverting amplifier section having a high voltage gain and a noninverting amplifier section having a low output impedance, a signal of a common connection terminal of said output terminals of the first and second switching means being input to the amplifier circuit via said capacitive element; and third switching means connected between input and output terminals of said amplifier circuit.

BRIEF DESCRIPTION OF THE DRAWINGS

FIG. 6 is a diagram showing a voltage comparator circuit according to an embodiment of the present invention;

FIG. 21 shows a circuit diagram of a voltage comparator circuit including an amplifier composed of the inverting amplifier of FIG. 7 and the noninverting amplifier of FIG. 15.

DETAILED DESCRIPTION OF THE PREFERRED EMBODIMENTS

An embodiment of the present invention will now be described hereinbelow, with reference to the drawings.

Figure 1:
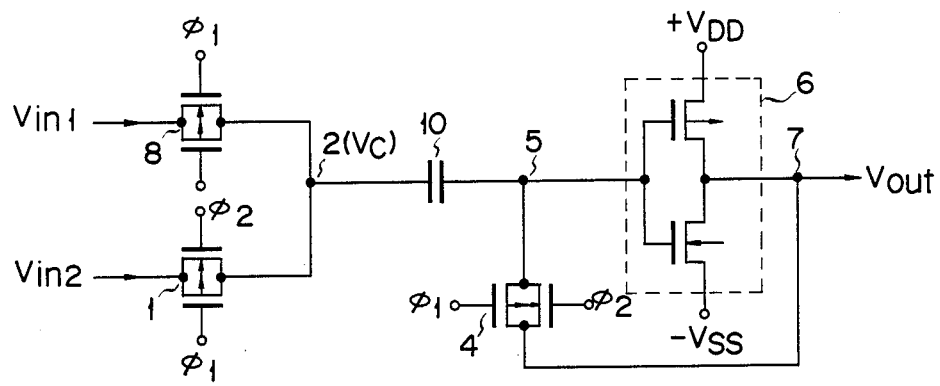
FIG. 1 is a diagram showing a conventional voltage comparator circuit.
Figure 2:
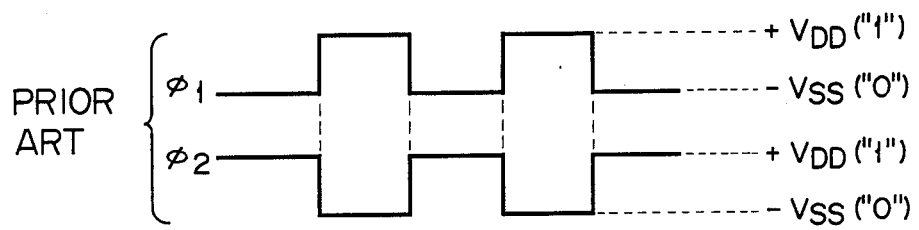
FIG. 2 shows clock signals which are input to the voltage comparator circuit of FIG. 1.
Figure 3:
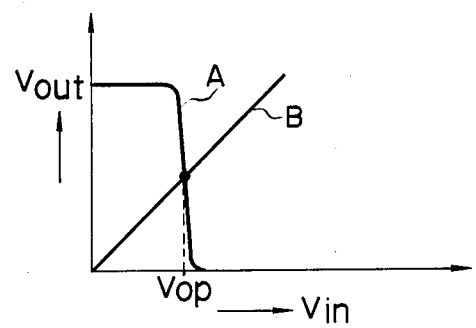
FIG. 3 shows curves of the input voltage to output voltage characteristics of an amplifier in the voltage comparator circuit of FIG. 1.
Figure 4:
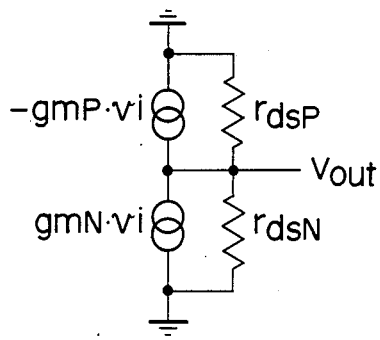
FIG. 4 is a circuit equivalent to the amplifier circuit in the voltage comparator circuit of FIG. 1.
Figure 5:
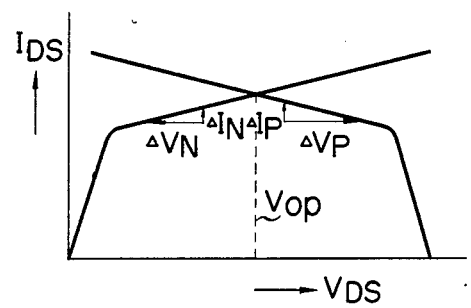
FIG. 5 shows curves of the drain-source voltage to drain-source current characteristics of the P-channel MOS transistor and the N-channel MOS transistor which constitute the amplifier in the voltage comparator circuit of FIG. 1.

FIG. 6 is a diagram of a voltage comparator circuit of the embodiment, and shows an example corresponding to the voltage comparator circuit shown in FIG. 1; therefore, the corresponding parts and components are designated by the same reference numerals. Input signals $V_{in1}$ and $V_{in2}$ are supplied to input terminals of transfer gates (switching means) 8 and 1 which is composed of a P-channel MOS transistor and an N-channel MOS transistor connected in parallel. The output terminals of transfer gates 8 and 1 are commonly connected, and a common connection terminal 2 is connected to an input terminal of amplifier 6 via capacitor 10. Transfer gate 4, which is also composed of a P-channel and N-channel MOS transistor connected in parallel, is inserted between the input terminal 5 and the output terminal 7 of amplifier 6. Output terminal 7 of amplifier 6 constitutes the output terminal of the complete circuit. Amplifier 6 is composed of a cascade circuit of an inverting amplifier 21 having a high voltage gain, and a noninverting amplifier 22 having a low output impedance. FIGS. 7 to 11 show practical examples of inverting amplifier 21, while FIGS. 12 to 15 show practical examples of noninverting amplifier 22. FIG. 16 shows a practical example of a current source. In FIGS. 7 to 16, reference numerals 31 to 40 denote P-channel type MOS transistors; 41 to 50, N-channel type MOS transistors; 51 to 56, current sources; and 57 and 58, resistors.

Figure 7:
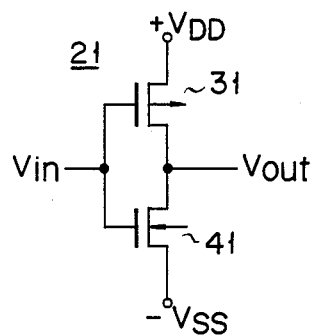
FIGS. 7 to 11 are circuit diagrams each showing a high-gain inverting amplifier section of an amplifier in the voltage comparator circuit of FIG. 6.

High voltage-gain inverting amplifier 21, shown in FIG. 7, is constituted by a CMOS inverter composed P-channel MOS transistor 31 and N-channel MOS transistor 41 which are serially connected between a high power source potential $V_{DD}$ and a low power source potential $V_{SS}$. Input voltage $V_{in}$ is applied to the gates of transistors 31 and 41. Output voltage $V_{out}$ is taken out from the node of transistors 31 and 41.

Figure 8:
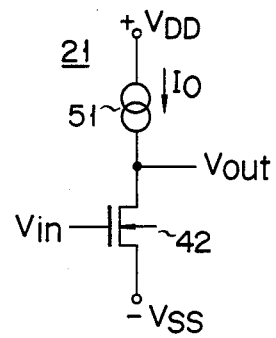

Inverting amplifier 21, shown in FIG. 8, is composed of current source 51 for feeding a current $I_O$ and N-channel MOS transistor 42 which are serially connected between potentials $V_{DD}$ and $V_{SS}$. Input voltage $V_{in}$ is applied to the gate of transistor 42. Output voltage $V_{out}$ is taken out from the node of current source 51 and transistor 42.

Figure 9:
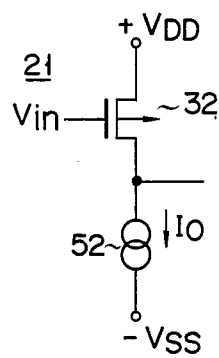

Inverting amplifier 21, shown in FIG. 9, is composed of P-channel MOS transistor 32 and current source 52 for feeding a current $I_O$ which are serially connected between potentials $V_{DD}$ and $V_{SS}$. Input voltage $V_{in}$ is applied to the gate of transistor 32. Output voltage $V_{out}$ is output from the node of transistor 32 and current source 52.

Figure 10:
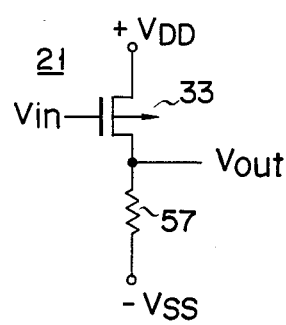

Inverting amplifier 21, shown in FIG. 10, is composed of P-channel MOS transistor 33 and resistor 57 which are serially connected between power source potentials $V_{DD}$ and $V_{SS}$. Input voltage $V_{in}$ is applied to the gate of transistors 33. Output voltage $V_{out}$ is output from the node of transistor 33 and resistor 57.

Figure 11:
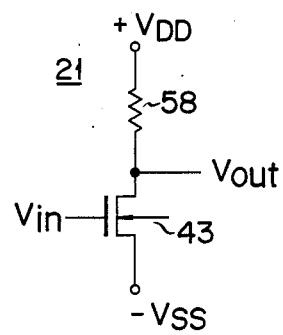

Inverting amplifier 21 of FIG. 11 is composed of resistor 58 and N-channel MOS transistor 43 which are serially connected between power source potentials $V_{DD}$ and $V_{SS}$. Input voltage $V_{in}$ is applied to the gate of transistor 43. Output voltage $V_{out}$ is output from the node of resistor 58 and transistor 43.

By increasing the channel lengths of CMOS transistors 31 and 41 in the circuit of FIG. 7, the voltage gain is increased. Similarly, by increasing the channel length of the transistor in the circuit of FIGS. 8, 9, 10 or 11, the voltage gain is increased.

Figure 12:
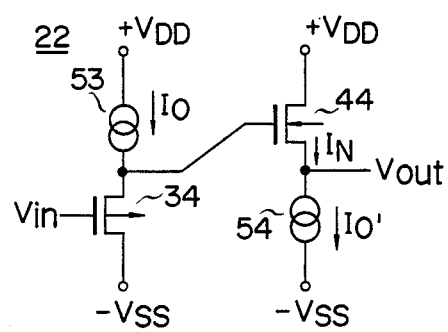
FIGS. 12 to 15 are circuit diagrams each showing a low-output impedance noninverting amplifier section of the amplifier in the voltage comparator circuit of FIG. 6.

Low-impedance noninverting amplifier 22, shown in FIG. 12, comprises: a series circuit composed of current source 53, for feeding a current $I_O$, and P-channel MOS transistor 34 which are serially connected between power source potentials $V_{DD}$ and $V_{SS}$; and a series circuit composed of N-channel MOS transistor 44 and current source 54, for feeding a current $I_0'$, which are serially connected between potentials $V_{DD}$ and $V_{SS}$.

Input voltage $V_{in}$ is applied to the gate of transistor 34. The gate of transistor 44 is connected to the node of current source 53 and transistor 34. Output voltage $V_{out}$ is output from the node of transistor 44 and current source 54.

Fundamentally, noninverting amplifier 22 of FIG. 12 is composed of a source follower circuit of transistor 34 and a source follower circuit of transistor 44 connected in cascade with each other.

Figure 13:
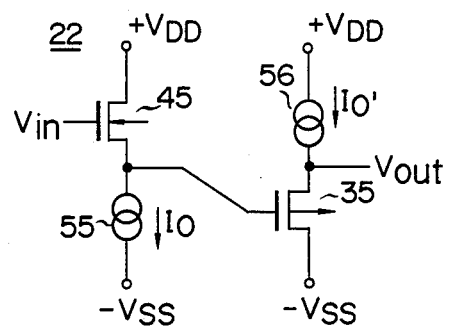

Noninverting amplifier 22, shown in FIG. 13, comprises: a series circuit composed of N-channel MOS transistor 45 and current source 55, for feeding current $I_O$, which are serially connected between potentials $V_{DD}$ and $V_{SS}$; and a series circuit composed of current source 56, for feeding current $I_O'$, and P-channel MOS transistor 35 which are serially connected between potentials $V_{DD}$ and $V_{SS}$. Input voltage $V_{in}$ is applied to the gate of transistor 45. The gate of transistor 35 is connected to the node of transistor 45 and current source 55. Output voltage $V_{out}$ is output from the node of current source 56 and transistor 35.

Fundamentally, noninverting amplifier 22 of FIG. 13 is composed of a source follower circuit of transistor 45 and a source follower circuit of transistor 35.

Figure 14:
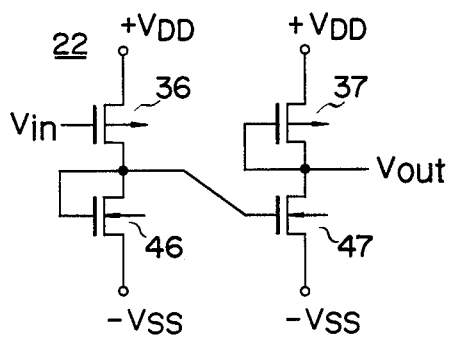

Noninverting amplifier 22 of FIG. 14 comprises: a series circuit composed of P-channel MOS transistor 36 and N-channel MOS transistor 46 which are serially connected between potentials $V_{DD}$ and $V_{SS}$; and a series circuit composed of P-channel MOS transistor 37 and N-channel MOS transistor 47 which are serially connected between potentials $V_{DD}$ and $V_{SS}$. Input voltage $V_{in}$ is applied to the gate of transistor 36. The gate of transistor 46 is connected to drain thereof and to the gate of transistor 47. The gate of transistor 37 is connected to drain thereof. Output voltage $V_{out}$ is output from the node of transistors 37 and 47.

Figure 15:
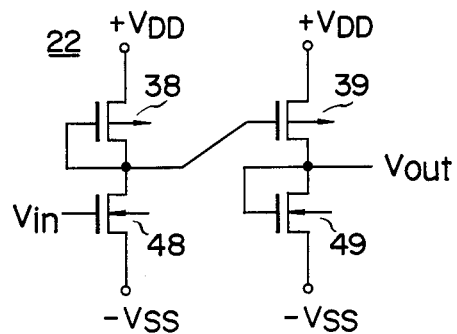
Figure 16:
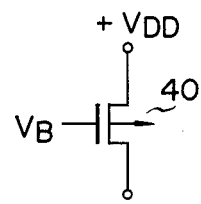
FIGS. 16 and 17 are circuit diagrams each showing a current source in the inverting amplifier sections of FIGS. 8 and 9, or current sources in the noninverting amplifier sections of FIGS. 12 and 13.

Noninverting amplifier 22 of FIG. 15 comprises: a series circuit composed of P-channel MOS transistor 38 and N-channel MOS transistor 48 which are serially connected between potentials $V_{DD}$ and $V_{SS}$; and a series circuit of P-channel MOS transistor 39 and N-channel MOS transistor 49 which are serially connected between potentials $V_{DD}$ and $V_{SS}$. Input voltage $V_{in}$ is applied to the gate of transistor 48. The gate of transistor 38 is connected to the drain thereof and to the gate of transistor 39. The gate of transistor 49 is connected to the drain thereof. Output voltage $V_{out}$ is output from the node of the drains of transistors 39 and 49.

The current source, shown in FIG. 16, is composed of P-channel MOS transistor 40 connected between power source potentials $V_{DD}$ and $V_{SS}$. A voltage $V_B$ is applied to the gate of transistor 40.

Figure 17:
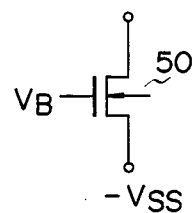

A current source shown in FIG. 17 is composed of N-channel MOS transistor 50 connected between potentials $V_{DD}$ and $V_{SS}$. A voltage $V_B$ is applied to the gate of transistor 50.

Let us obtain voltage gain $K_O$ and output impedance $Z_{out}$ of the source follower type inverting amplifier circuit 22 of FIG. 12. With regard to the amplifier circuit of FIG. 12, the following expressions are obtained:

$$gmN(\Delta V_{inN} - \Delta V_{outN}) = \frac{\Delta V_{outN}}{r_{dsN}}$$

$$gmP(\Delta V_{inP} - \Delta V_{outP}) = \frac{\Delta V_{outP}}{r_{dsP}}$$

$\Delta V_{inN}$ denotes a microchange in the amount of the voltage which is applied to the gate of N-channel MOS transistor 44. $\Delta V_{outN}$ denotes a microchange in the amount of $V_{out}$ of transistor 44. From the above expressions, a voltage gain $K_1$ of the input circuit comprising transistor 34 and a voltage gain $K_2$ of the output circuit comprising transistor 44 can be expressed as follows:

$$K_1 = \frac{\Delta V_{outN}}{\Delta V_{inN}} = \frac{gmN \cdot r_{dsN}}{1 + gmN \cdot r_{dsN}} \simeq 1$$

$$K_2 = \frac{\Delta V_{outP}}{\Delta V_{inP}} = \frac{gmP \cdot r_{dsP}}{1 + gmP \cdot r_{dsP}} \simeq 1$$

As understood from these equations, the voltage gain $K_O$ of the source follower circuit of FIG. 12 becomes almost 1.

Output impedance $Z_{out}$ is shown by $$Z_{out} = r_{dsN} = \frac{1}{gmN}$$

where $$gmN = \sqrt{2\beta_N I_N} \text{ and } \beta_N = \frac{W}{L} \cdot \frac{\mu \epsilon_{ox}}{T_{ox}}$$

$I_N$ is a current flowing through N channel MOS transistor 44. W and L denote the channel width and the channel length of transistor 44. $T_{ox}$ denotes the thickness of the gate insulation film of transistor 44. $\epsilon_{ox}$ denotes the dielectric of the gate insulation film of transistor 44. $\mu$ denotes a mobility of electrons in the gate insulation film of transistor 44.

Let us obtain the voltage gain $K_O$ and output impedance $Z_{out}$ of the case where the amplifier circuit of FIG. 14. First, a microchange in the amount $\Delta_i$ of the current flowing through transistor 47 is denoted as follows:

$$\Delta_i = gmN2 \cdot \Delta V_{in} \text{ or } \Delta_i = gmP2 \cdot \Delta V_{out}$$

where, gmN2 denotes a mutual conductance of transistor 47, gmP2 denotes a mutual conductance of transistor 37, $\Delta V_{out2}$ denotes a microchange in the amount of the output voltage of the amplifier composed of transistors 37 and 47, and $\Delta V_{in2}$ denotes a microchange in the amount of the gate input voltage of transistor 47. From the above expressions, a voltage gain $K_2$ and output impedance $Z_{out}$, of the output side amplifier which is constituted by transistors 37 and 47, will be $$K_2 = \frac{\Delta V_{out2}}{\Delta V_{in2}} = \frac{gmN2}{gmP2}$$

-continued $$Z_{out} = \frac{\Delta V_{out2}}{\Delta_i} = \frac{1}{gmP2}$$

Similarly, voltage gain $K_1$ of the input side amplifier composed of transistors 36 and 46 becomes $$K_1 = \frac{gmP1}{gmN1}$$

where, gmP1 denotes a mutual conductance of transistor 36 and gmN1 denotes a mutual conductance of transistor 46.

By setting gmP1=gmN1 and gmP2=gmN2, voltage gain A of the amplifier of FIG. 14 becomes $K_O = 1$.

In the noninverting amplifier circuits of the foregoing examples, the voltage gain becomes 1, and the output impedance is determined by transistors 44 or 47. Therefore, by widening channel widths W of transistors 44 or 47, and by reducing channel lengths L thereof, the noninverting amplifier circuits of the examples each have a low output impedance.

Therefore, when the circuit shown in each of FIGS. 7 to 11 is used as inverting amplifier 21 having a high voltage gain, and the circuit shown in each of FIGS. 12 to 15 is used as noninverting amplifier 22 having a low output impedance, the voltage gain of amplifier 6 of voltage comparator circuit of FIG. 6 is determined by the voltage gain of inverting amplifier 21, having a high gain, and the output impedance is determined by the output impedance of noninverting amplifier 22, having a low output impedance. Thus, an amplifier 6 of a large voltage gain and a small output impedance is provided.

Figure 18:
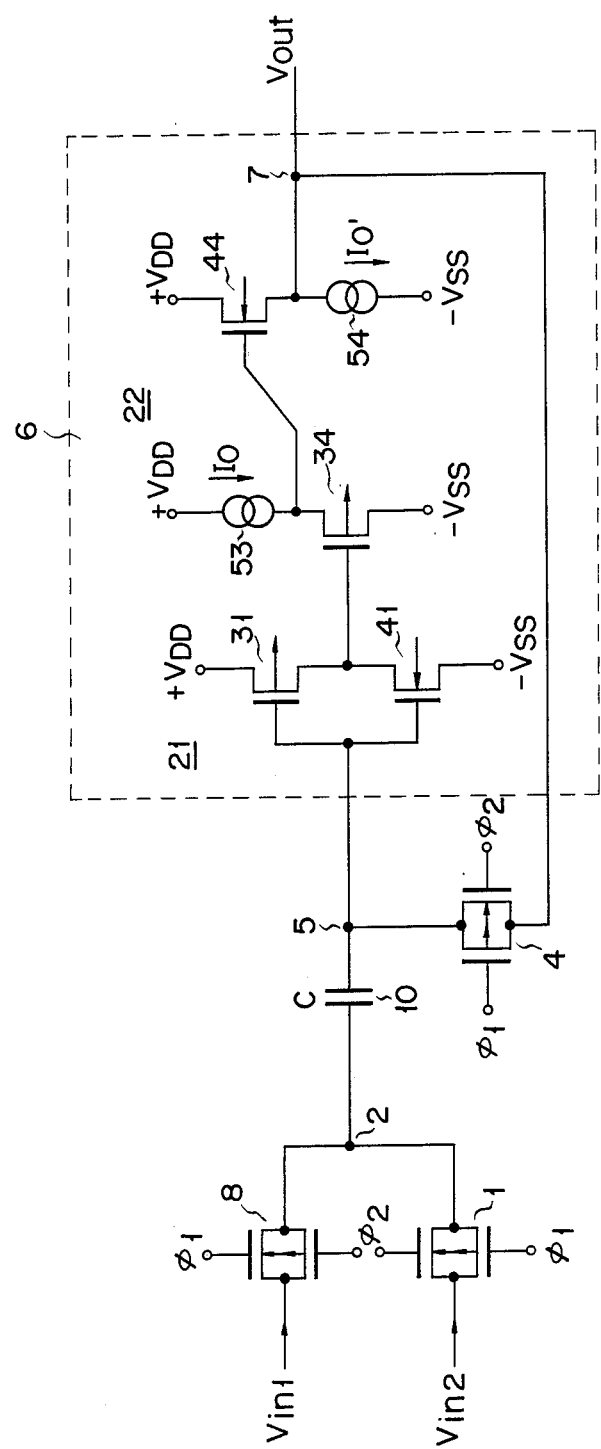
FIG. 18 shows a circuit diagram of a voltage comparator circuit including an amplifier composed of the inverting amplifier of FIG. 7 and the noninverting amplifier of FIG. 12.

In the comparator circuit of FIG. 18, amplifier 6 is composed of the inverting amplifier 21 of FIG. 7 and the noninverting amplifier 22 of FIG. 12.

Gates of transistors 31 and 41 of inverting amplifier 21 are commonly connected to each other. The common gate node of transistors 31 and 41 constitutes an input terminal of amplifier 6 and is connected to the output terminal of capacitor C. Transistors 31 and 41 are connected in series between high power source potential $V_{DD}$ and low power source potential $V_{SS}$. The common node of the drain-source paths of transistors 31 and 41 is connected to the gate of transistor 34 of noninverting amplifier 22. One terminal of the drain-source path of transistor 34 is connected to high power source potential $V_{DD}$ via current source 53 and the other terminal is connected to power source potential $V_{SS}$. The node of current source 53 and transistor 34 is connected to the gate of transistor 44. One terminal of the drain-source path of transistor 44 is connected to high power source potential $V_{DD}$ and the other terminal is connected to power source potential $V_{SS}$ via current source 54. The node of transistor 44 and current source 54 of noninverting amplifier 22 is connected to the output terminal of the complete circuit of FIG. 18.

In the comparator circuit of FIG. 18, amplifier 6 is comprised of inverting amplifier 21 having a high gain and noninverting amplifier 22 having a low output impedance. Therefore, the comparator circuit has a high input sensitivity. The comparator circuit can also operate at a high speed.

Figure 19:
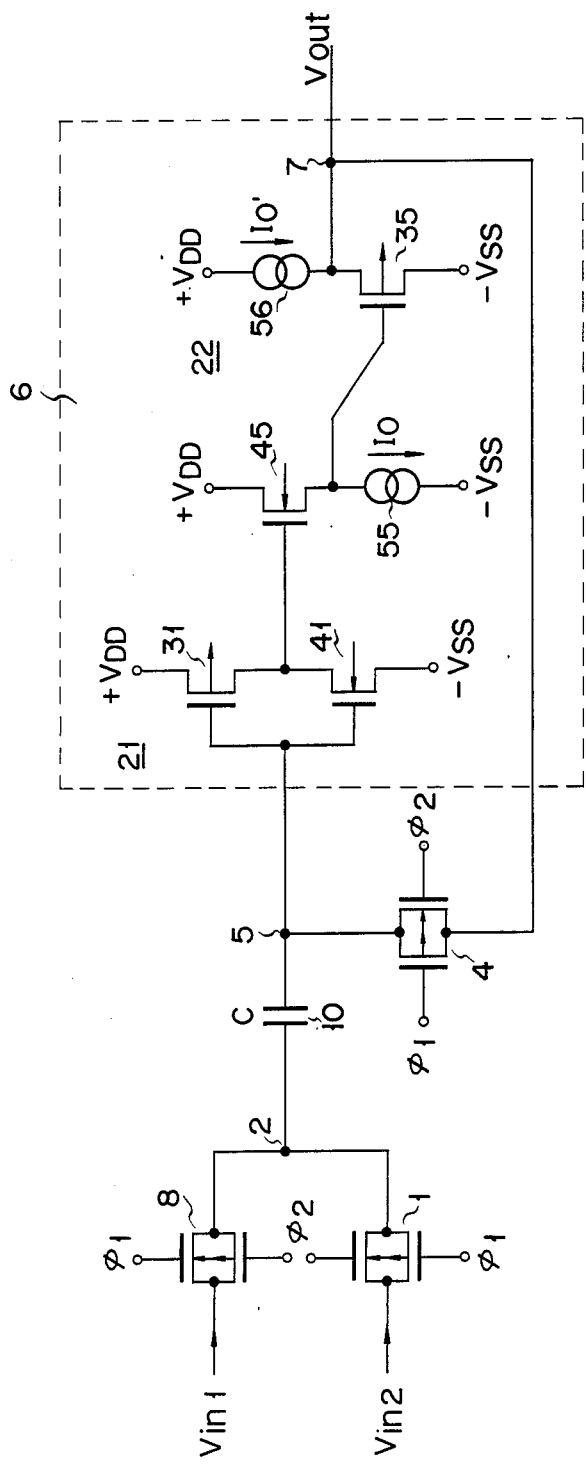
FIG. 19 shows a circuit diagram of a voltage comparator circuit including an amplifier composed of the inverting amplifier of FIG. 7 and the noninverting amplifier of FIG. 13.

In the comparator circuit of FIG. 19, amplifier 6 is composed of the inverting amplifier 21 of FIG. 7 and the noninverting amplifier 22 of FIG. 13.

The common gate node of transistors 31 and 41 of inverting amplifier 21 is connected to the output terminal of capacitor C. The common node of the drain-source paths of transistors 31 and 41 is connected to the gate of transistor 45 of noninverting amplifier 22. The node of current source 56 and transistor 35 of noninverting amplifier 22 is connected to the output terminal of the complete circuit of FIG. 19.

Figure 20:
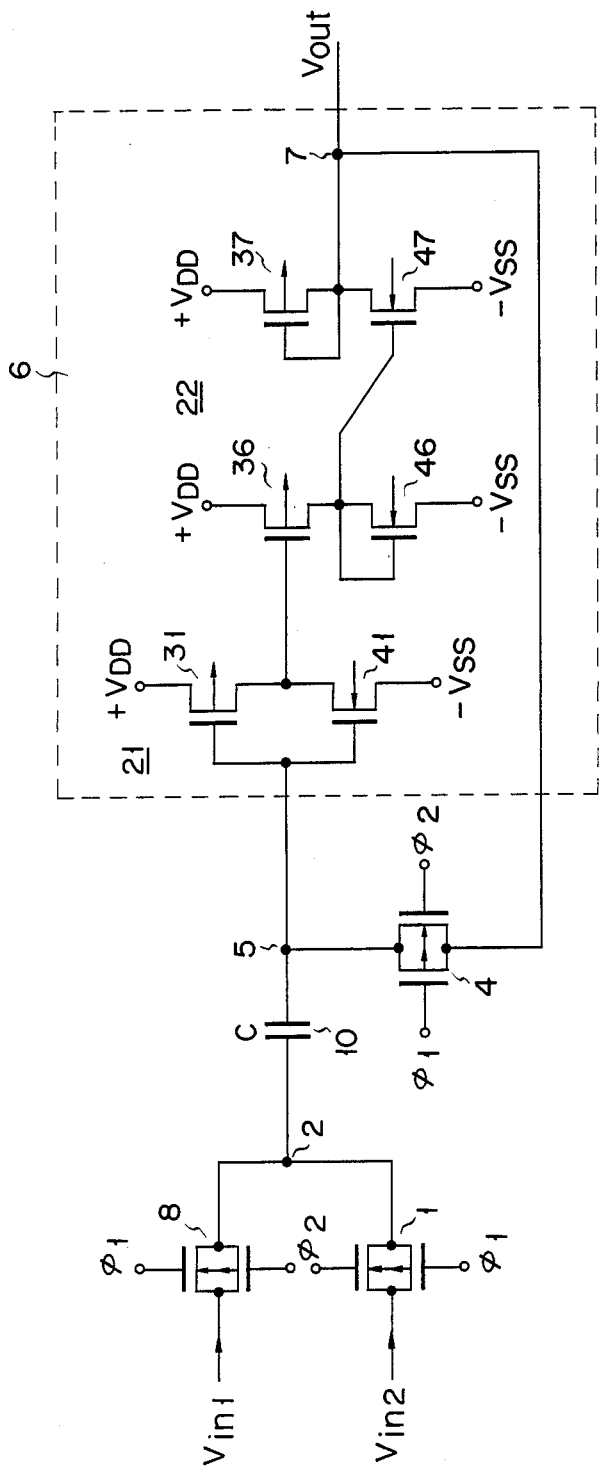
FIG. 20 shows a circuit diagram of a voltage comparator circuit including an amplifier composed of the inverting amplifier of FIG. 7 and the noninverting amplifier of FIG. 14.

In the comparator circuit of FIG. 20, amplifier 6 is composed of the inverting amplifier 21 of FIG. 7 and the noninverting amplifier 22 of FIG. 14.

The common gate node of transistors 31 and 41 of inverting amplifier 21 is connected to the output terminal of capacitor C. The common node of the drain-source paths of transistors 31 and 41 is connected to the gate of transistor 36 of noninverting amplifier 22. The node of transistor 37 and transistor 47 of noninverting amplifier 22 is connected to the output terminal of the complete circuit of FIG. 20.

In the comparator circuit of FIG. 21, amplifier 6 is composed of the inverting amplifier 21 of FIG. 7 and the noninverting amplifier 22 of FIG. 15.

The common gate node of transistors 31 and 41 of inverting amplifier 21 is connected to the output terminal of capacitor C. The common node of the drain-source paths of transistors 31 and 41 is connected to the gate of transistor 38 of noninverting amplifier 22. The node of transistor 39 and transistor 49 of inverting amplifier 22 is connected to the output terminal of the complete circuit of FIG. 21.

In the comparator circuit of FIG. 19, 20 or 21, amplifier 6 is comprised of inverting amplifier 21 having a high gain and noninverting amplifier 22 having a low output impedance. Therefore, the comparator circuit has a high input sensitivity. The comparator circuit can also operate at a high speed.

As has been described above, according to the present invention, the voltage gain of the amplifier can be increased, and the output impedance can be reduced. Therefore, a voltage comparator circuit having a high speed and a high input sensitivity can be provided, in contrast to the conventional circuit.

What is claimed is:

1. A voltage comparator circuit comprising:
   first and second switching means to whose input terminals first and second input signals are respectively input, output terminals of said first and second switching means being commonly connected;
   a capacitive element;
   an amplifier circuit comprising a cascade circuit of an inverting amplifier section having a high voltage gain and a non-inverting amplifier section having a low output impedance, a signal of a common connection terminal of said output terminals of the first and second switching means being input to the amplifier circuit via said capacitive element, said inverting amplifier section being constituted by a complementary type MOS inverter composed of a P-channel type MOS transistor and an N-channel type MOS transistor, and said non-inverting amplifier section being constituted by a cascade connection circuit composed of a source follower circuit of a P-channel type MOS transistor and a source follower circuit of an N-channel type MOS transistor; and
   third switching means connected between input and output terminals of said amplifier circuit.

2. A voltage comparator circuit comprising:

first and second switching means to whose input terminals, first and second input signals are respectively input, output terminals of said first and second switching means being commonly connected;

a capacitive element;

an amplifier circuit comprising a cascade circuit of an inverting amplifier section having a high voltage gain and a non-inverting amplifier section having a low output impedance, a signal of a common connection terminal of said output terminals of the first and second switching means being input to the amplifier circuit via said capacitive element, said inverting amplifier section being constituted by a complementary type MOS inverter composed of a P-channel type MOS transistor and an N-channel type MOS transistor, and said non-inverting amplifier section being constituted by a cascade connection circuit composed of a source follower circuit of an N-channel type MOS transistor and a source follower circuit of a P-channel type MOS transistor; and third switching means connected between input and output terminals of said amplifier circuit.

3. A voltage comparator circuit comprising:

first and second switching means to whose input terminals first and second input signals are respectively input, output terminals of said first and second switching means being commonly connected;

a capacitive element;

an amplifier circuit comprising a cascade circuit of an inverting amplifier section having a high voltage gain and a non-inverting amplifier section having a low output impedance, a signal of a common connection terminal of said output terminals of the first and second switching means being input to the amplifier circuit via said capacitive element, said inverting amplifier section being constituted by a complementary type MOS inverter of a P-channel type transistor and an N-channel MOS type transistor, and said non-inverting amplifier section being constituted in a manner such that a first P-channel type MOS transistor and a first N-channel type MOS transistor are serially connected between said first and second power sources, a second P-channel type MOS transistor and a second N-channel type MOS transistor are serially connected between said first and second power sources, the gate of said first N-channel type MOS transistor is commonly connected to the drain thereof and to the gate of said second N-channel type MOS transistor, the gate of said second P-channel MOS transistor is connected to the drain thereof, the gate of said first P-channel type MOS transistor is used as the input terminal, and the drain of said second P-channel type MOS transistor is used as the output terminal; and third switching means connected between input and output terminals of said amplifier circuit.

4. A voltage comparator circuit comprising:

first and second switching means to whose input terminals first and second input signals are respectively input, output terminals of said first and second switching means being commonly connected;

a capacitive element;

an amplifier circuit comprising a cascade circuit of an inverting amplifier section having a high voltage gain and a non-inverting amplifier section having a low output impedance, a signal of a common connection terminal of said output terminals of the first and second switching means being input to the amplifier circuit via said capacitive element, said inverting amplifier section being constituted by a complementary type MOS inverter of a P-channel type MOS transistor and an N-channel type MOS transistor, and said non-inverting amplifier section being constituted in a manner such that a first P-channel type MOS transistor and a first N-channel type MOS transistor are serially connected between first and second power sources, a second P-channel type MOS transistor and a second N-channel MOS transistor are serially connected between said first and second power sources, the gate of said first P-channel type MOS transistor is commonly connected to the drain thereof and to the gate of said second P-channel type MOS transistor, the gate of said second N-channel type MOS transistor is connected to the drain thereof, the gate of said first N-channel type MOS transistor is used as the input terminal, and the drain of said second N-channel type MOS transistor is used as the output terminal; and third switching means connected between input and output terminals of said amplifier circuit.

* * * * *